United States Patent

Takizawa

[19]

[11] Patent Number: 6,124,598

[45] Date of Patent: Sep. 26, 2000

[54] PATTERN EXPOSURE METHOD AND SYSTEM

[75] Inventor: Atsushi Takizawa, Kawasaki, Japan

[73] Assignee: Fujitsu Limited, Kawasaki, Japan

[21] Appl. No.: 09/132,820

[22] Filed: Aug. 12, 1998

[30] Foreign Application Priority Data

Aug. 13, 1997 [JP] Japan ................................. 9-218717
Aug. 4, 1998 [JP] Japan ................................. 10-220050

[51] Int. Cl.$^7$ .................................................. H01J 37/30
[52] U.S. Cl. ................................. 250/491.1; 250/492.2
[58] Field of Search ........................... 250/491.1, 492.2, 250/398

[56] References Cited

U.S. PATENT DOCUMENTS 4,591,540  5/1986  Bohlen et al. ............................ 430/22
5,329,130  7/1994  Kai et al. ............................ 250/491.1
5,508,527  4/1996  Kuroda et al. ....................... 250/491.1
5,525,808  6/1996  Irie et al. ................................ 250/548
5,608,226  3/1997  Yamada et al. .................... 250/491.1
5,795,687  8/1998  Yasuda ................................ 250/491.1

Primary Examiner—Bruce C. Anderson
Attorney, Agent, or Firm—Staas & Halsey, LLP

[57] ABSTRACT

The pattern exposure method formes a pattern by a combination of a reduction projection exposure system 10 and an electron beam exposure system 20. An optical strain in a region of a prescribed size exposed by the reduction projection exposure system 10 is measured by a coordinates detection system 30. A first pattern of a shot size is exposed by the reduction projection exposure system 10, and a second pattern to be superimposed on the first pattern is formed by the electron beam exposure system 20, correcting based on a correction value which is based on the optical strain in the region of the prescribed size measured by the coordinates detection system 30.

23 Claims, 12 Drawing Sheets

FIG. 5

S21
GIVE OPTICAL STRAIN OF REDUCTION PROJECTION EXPOSURE SYSTEM AND INPUT OPTICAL STRAIN DATA OF REDUCTION PROJECTION EXPOSURE SYSTEM IN ELECTRON BEAM EXPOSURE SYSTEM AS CORRECTION VALUE (STEP S11~S16)

S22
TRANSFER DEVICE PATTERN AND MEASUREMENT PATTERN TO PRODUCT WAFER BY REDUCTION PROJECTION EXPOSURE SYSTEM

S23
MEASURE COORDINATES OF MEASUREMENT PATTERN ON PRODUCT WAFER BY ELECTRON BEAM EXPOSURE SYSTEM TO GIVE EXPANSION RATIO OF PRODUCT WAFER

S24
INPUT EXPANSION RATIO DATA OF PRODUCT WAFER IN ELECTRON BEAM EXPOSURE SYSTEM AS CORRECTION VALUE

S25
EXPOSE NEXT LAYER BY ELECTRON BEAM EXPOSURE SYSTEM, USING OPTICAL STRAIN DATA OF REDUCTION PROJECTION EXPOSURE SYSTEM WHICH HAS EXPOSED PREVIOUS LAYER AND EXPANSION DATA

PATTERN EXPOSURE METHOD AND SYSTEM

BACKGROUND OF THE INVENTION

The present invention relates to a pattern exposure method and system for forming a pattern by a combination of a reduction projection exposure system and an electron beam exposure system.

Recently semiconductor devices have been increasingly integrated, and sub-micron pattern rules are required. Pattern formation by the use of conventional reduction projection exposure systems will find it impossible to meet such rules. Pattern formation by means of a combination of exposure systems having principles different from each other, i.e., a reduction projection exposure system and an electron beam exposure system, has been again noted.

In a case that a pattern is formed by a combination of exposure systems of different principles from each other, i.e., a reduction projection exposure system and an electron beam exposure system, a problem is accuracy of positioning between patterns formed by the respective exposure systems.

For example, when a pattern is superimposed by the electron beam exposure system, ignoring optical strains caused by the reduction projection exposure system, positioning accuracy is deteriorated especially at a peripheral part of a semiconductor chip, with a result of positioning errors.

As conventional art for preventing positioning errors between a reduction projection exposure system and a charged particle beam exposure system, e.g., the electron beam exposure system, are known those described in Japanese Patent Laid-Open Publication No. 58621/1987 and Japanese Patent Laid-Open Publication No. 149127/1987. In these conventional art an amounts of an optical strain of the reduction projection exposure system is measured in advance by the charged particle beam exposure system, and when an actual pattern is exposed, corrections are made based on the pre-measured optical strain.

However, in the conventional art an optical strain amount caused by the reduction projection exposure system is measured by a charged particle beam exposure system, and a measured value advertently contains, in addition to an optical strain of the reduction projection exposure system, a productional error of a reticle and a measurement error of the electron beam exposure system. Accordingly, although positioning is performed based on a measured value of the electron beam exposure system, defective positioning of the reduction projection exposure system with respect to the electron beam exposure system cannot be effectively prevented.

SUMMARY OF THE INVENTION

An object of the present invention is to provide a pattern exposure method and system which can effectively prevent positioning error when a pattern is formed by a combination of a reduction projection exposure system and an electron beam exposure system.

The above-described object is-achieved by a pattern exposure method for exposing a pattern by a reduction projection exposure system and an electron beam exposure system, the method comprising: the first step of measuring by a first coordinates detection system an optical strain in a region of a prescribed size to be exposed by the reduction projection exposure system; the second step of exposing a first pattern of a shot size by the reduction projection exposure system; and the third step of exposing by the electron beam exposure system a second pattern to be superimposed on the first pattern, correcting based on a correction value which is based on the optical strain in the region of the prescribed size measured by the first coordinates detection system.

In the above-described pattern exposure method, it is possible that in the first step, the optical strain of the reduction projection exposure system is measured by subtracting a positioning error of a measurement pattern arranged on a reticle from positioning coordinates of the measurement pattern transferred onto a wafer by the use of the reticle.

In the above-described pattern exposure method, it is possible that the method further comprises prior to the third step the step of measuring an expansion ratio of the wafer with the first pattern exposed, based on the first pattern, in the third step, the second pattern to be superimposed on the first pattern is exposed by the electron beam exposure system, correcting in consideration of, in addition, a correction value based on the expansion ratio of the wafer.

In the above-described pattern exposure method, it is possible that the method further comprises the step of measuring displacement accuracy of a stage of the electron beam exposure system by a second coordinates detection system, in the third step the second pattern to be superimposed on the first pattern is exposed by the electron beam exposure system, correcting in consideration of, in addition, a correction value based on the displacement accuracy of the stage measured by the second coordinates detection system.

In the above-described pattern exposure method, it is preferable that a measured value convertibility between the first and the second coordinates detection systems is below 0.2 $\mu$m.

In the above-described pattern exposure method, it is preferable that the first and the second coordinates detection systems are one and the same.

In the above-described pattern exposure method, it is possible that in the first step the optical strain is measured in the region of the shot size.

In the above-described pattern exposure method, it is possible that in the first step the optical strain is measured at an outermost periphery of the region of the shot size.

In the above-described pattern exposure method, it is possible that in the third step an optical strain in an inner part of the region of the shot size is converted from the optical strain in the outermost periphery of the region of the shot size measured in the first step, and based on a correction value based on the converted optical strain the electron beam exposure system is corrected.

In the above-described pattern exposure method, it is possible that in the first step the optical strain is measured at each of measurement points arranged in a matrix in a inner part of the region of the shot size.

In the above-described pattern exposure method, it is possible that in the first step the optical strain is measured in a region of a maximum exposure size containing the shot size of the reduction projection exposure system.

In the above-described pattern exposure method, it is possible that in the first step the optical strain is measured in an outermost periphery of the region of the maximum exposure size.

In the above-described pattern exposure method, it is possible that in the third step an optical strain in an inner part of the region of the shot size is converted from the optical strain in the outermost periphery of the region of the maximum exposure size measured in the first step, and based on a correction value based on the converted optical strain the electron beam exposure system is corrected.

In the above-described pattern exposure method, it is possible that in the first step the optical strain are measured at each of measurement points arranged in a matrix in an inner part of the region of the maximum exposure size.

In the above-described pattern exposure method, it is possible that in the first step the optical strain is measured at each of measurement points arranged on radial lines with respect to an optical axis of the reduction projection exposure system.

In the above-described pattern exposure method, it is possible that in the first step, optical strains of plural reduction projection exposure systems are measured, and correction values based on the optical strains of the plural reduction projection exposure systems are inputted into the electron beam exposure system; in the second step, the first pattern is exposed using one of the plural reduction projection exposure systems; and in the third step, the second pattern is exposed referring the correction value of the reduction projection exposure system which has exposed the first pattern.

The above-described object is achieved by a pattern exposure system for exposing a pattern by a reduction projection exposure system and an electron beam exposure system, the system comprising a coordinates detection system for measuring an optical strain in a region of a prescribed size to be exposed by the reduction projection exposure system, the system being for conducting a pattern exposure method comprising the first step of measuring by the coordinates detection system an optical strain in the region of the prescribed size to be exposed by the reduction projection exposure system; a second step of exposing a first pattern of a shot size by the reduction projection exposure system; and the third step of exposing by the electron beam exposure system a second pattern to be superimposed on the first pattern, correcting based on a correction value which is based on the optical strain in the region of the prescribed size measured by the coordinates detection system.

In the above-described pattern exposure system, it is possible that the system further comprises, for conducting a pattern exposure method, prior to the third step the step of measuring an expansion ratio of the wafer with the first pattern exposed, based on the first pattern, and in which in the third step the second pattern to be superimposed on the first pattern is exposed by the electron beam exposure system, correcting in consideration of, in addition, a correction value based on the expansion ratio of the wafer.

In the above-described pattern exposure system, it is possible that the system further comprises, for conducting a pattern exposure method, the step of measuring displacement accuracy of a stage of the electron beam exposure system by the coordinates detection system, and in which in the third step the second pattern to be superimposed on the first pattern is exposed by the electron beam exposure system, correcting in consideration of, in addition, a correction value based on the displacement accuracy of the stage measured by the coordinates detection system.

In the above-described pattern exposure system, it is possible that the system further comprises plural reduction projection exposure systems, and the electron beam exposure system being set correction values of optical strains of the plural reduction projection exposure systems, and in which in the third step the second pattern is exposed referring the correction value of the reduction projection exposure system which has exposed the first pattern.

BRIEF DESCRIPTION OF THE DRAWINGS

FIG. 5 is a flow chart of the pattern exposure method according to a second embodiment of the present invention.

DETAILED DESCRIPTION OF THE INVENTION

[A First Embodiment]

Figure 1:
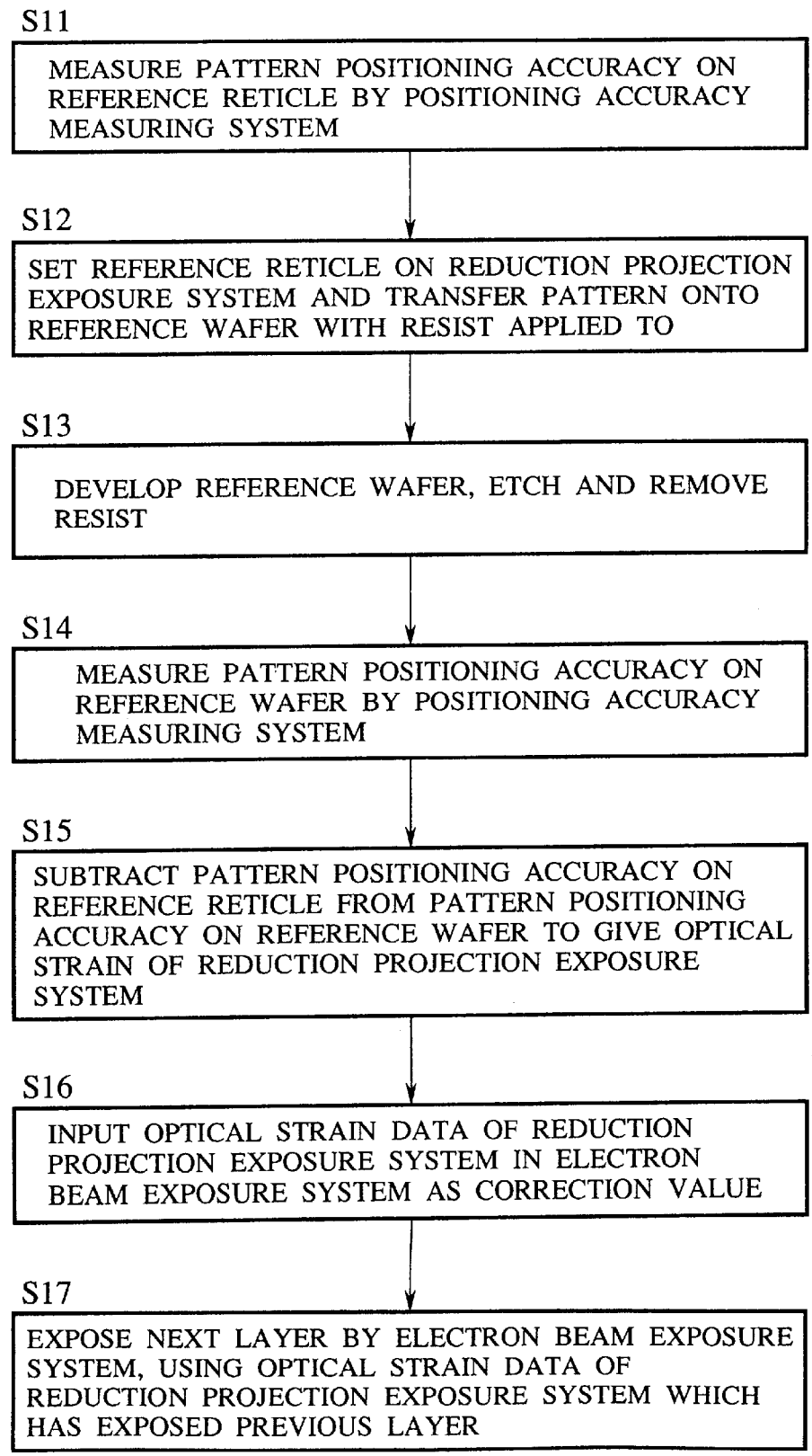
FIG. 1 is a flow chart of the pattern exposure method according to a first embodiment of the present invention.
Figure 2:
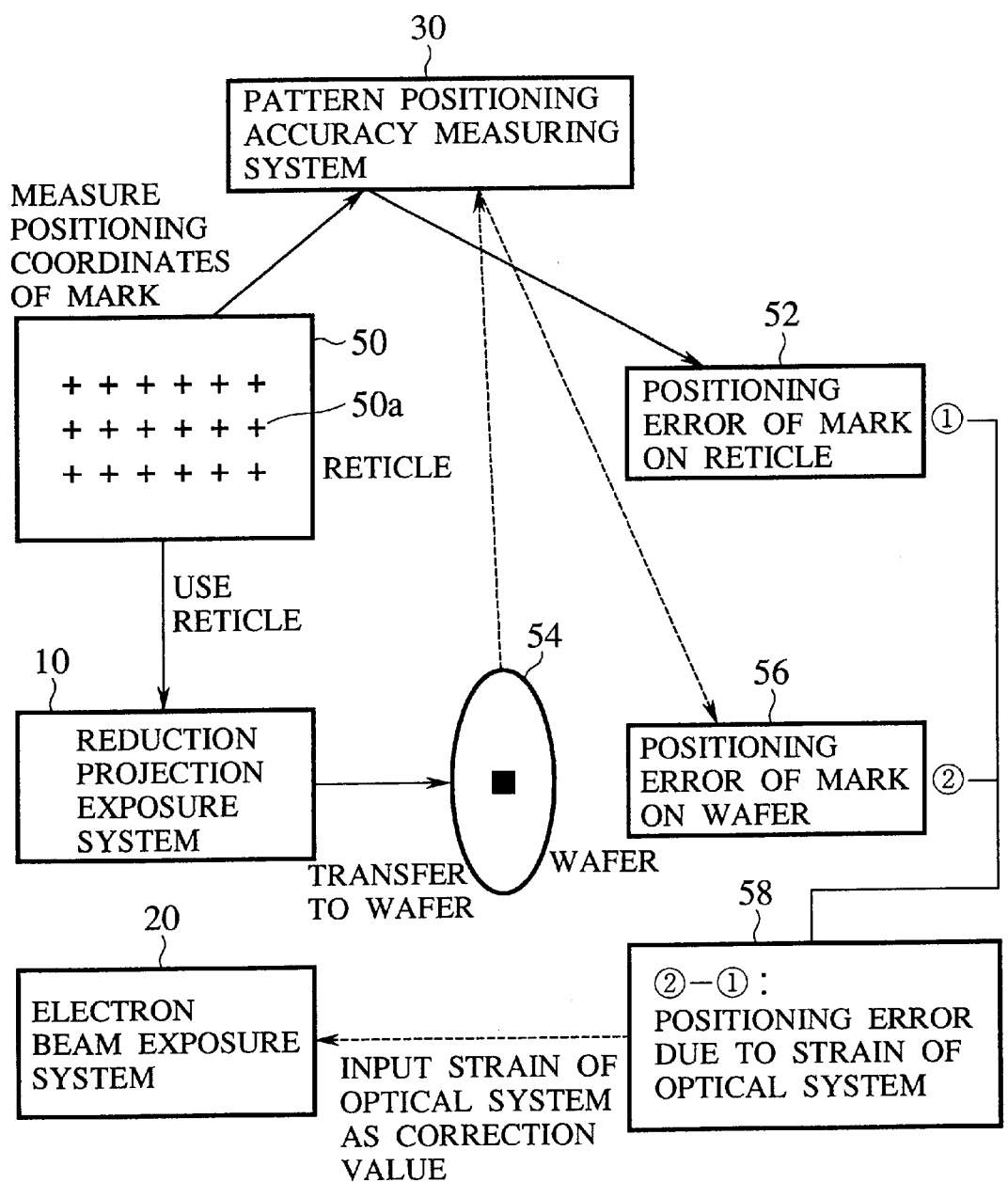
FIG. 2 is an explanatory view of the pattern exposure method according to the first embodiment of the present invention.

The pattern exposure method according to a first embodiment of the present invention will be explained with reference to FIGS. 1 to 5. FIG. 1 is a flow chart of the pattern exposure method according to the present embodiment. FIG. 2 is an explanatory view of the pattern exposure method according to the present embodiment.

To conduct the pattern exposure method according to the present embodiment, as shown in FIG. 2, in addition to a reduction projection exposure system 10 (called also a stepper) and an electron beam exposure system 20, a coordinates detection system 30 (called also a pattern positioning accuracy measuring system exemplified by "KOHA 5i" (tradename) by NIKON) for measuring an optical strain of the reduction projection exposure system 10 is used.

The pattern exposure method according to the present embodiment will be explained with reference to the flow chart of FIG. 1.

As a reference reticle 50 a reticle having a pattern of a number of measurement marks 50a arranged in a matrix is prepared. Positioning accuracy of the measurement marks 50a of the reference reticle 50 is measured by the coordinates detection system 30 (Step S11). Data of the measured positioning accuracy are stored in a memory (not shown) in the coordinates detection system 30 as positioning error data 52 of the measurement marks 50a on the reference reticle

50. Positioning error data 52 of the measurement marks on the reference reticle 50 are respectively expressed by, e.g., {(Xr−Ya), (Yr−Ya)} wherein ideal positioning coordinates of the pattern on the reticle are represented by (Xa,Ya), and measured positioning coordinates of the pattern on the reticle are represented by (Xr,Yr).

Next, a wafer with a resist applied to is prepared as a reference wafer 54. The reference reticle 50 is set on the reduction projection exposure system 10, and the pattern of the reference reticle 50 is transferred onto the reference wafer 54 (Step S12). At this time the reduction projection exposure system 10 transfers the reference reticle 50 in a shot size onto the reference wafer 54.

Next, the resist applied to the reference wafer 54 is developed, and with the resist as a mask the wafer is etched, and then the resist is removed (Step S13).

Then, positioning accuracy of the measurement pattern transferred onto the reference wafer 54 is measured by the coordinates detection system 30 (Step S14). Measured data of the positioning accuracy are stored in a memory (not shown) of the coordinates detection system 30 as positioning error data 56 of the measurement marks on the reference wafer 54.

Next, the coordinates detection system 30 subtracts the positioning error data 52 of the measurement marks 50*a* on the reference reticle 50 from the positioning error data 56 of the measurement marks on the reference wafer 54 to give positioning error data 58 due to an optical strain of the reduction projection exposure system 10, and the positioning error data 58 are stored in a memory (not shown) of the coordinate detection system 30 (Step S15). In a case that the reference reticle 50 has an N-time magnification, positioning error data 52 of the measurement marks on the reference reticle 50 are reduced by 1/N for the computation. For example, the reference reticle 50 has a 5-time magnification, positioning error data 52 are reduced by ⅕. That is, the positioning error data 58 due to an optical strain of the reduction projection exposure system 10 are respectively expressed by, e.g., {Xw−(Xr−Xa)/5, Yw−(Yr−Ya)/5} wherein measured positioning coordinates of the pattern on the reference wafer 54 are (Xw,Yw), and a magnification N of the reticle is 5.

Figure 3A:
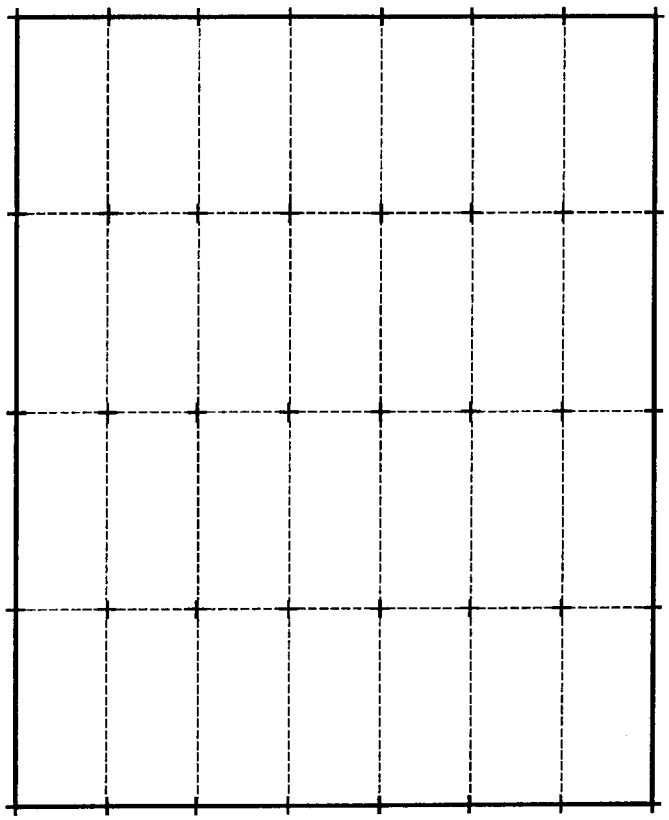
FIGS. 3A and 3B are views of examples of positioning error data of the pattern exposure method according to the first embodiment of the present invention.
Figure 3B:
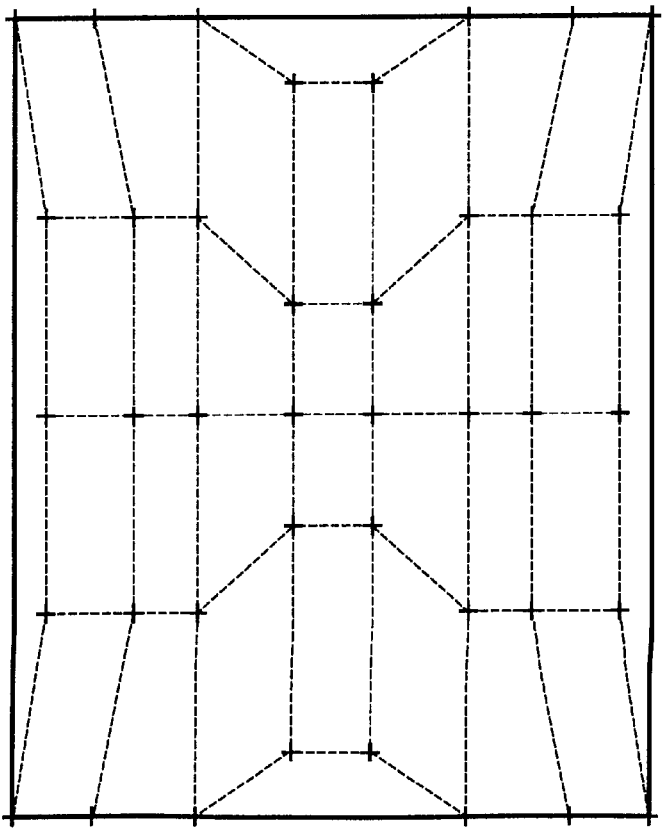

FIGS. 3A and 3B show examples of the positioning error data 58 due to an optical strains given in Step S15. When the reduction projection exposure system 10 is totally free from an optical strain, as shown in FIG. 3A a pattern of a matrix of the measurement marks equidistantly arranged in a shot size, but due to an optical strain of the reduction projection exposure system 10, positioning errors shown in FIG. 3B take place. That is, when the pattern is exposed by the reduction projection exposure system 10, the positioning errors shown in FIG. 3B occur in a shot size.

Figure 4:
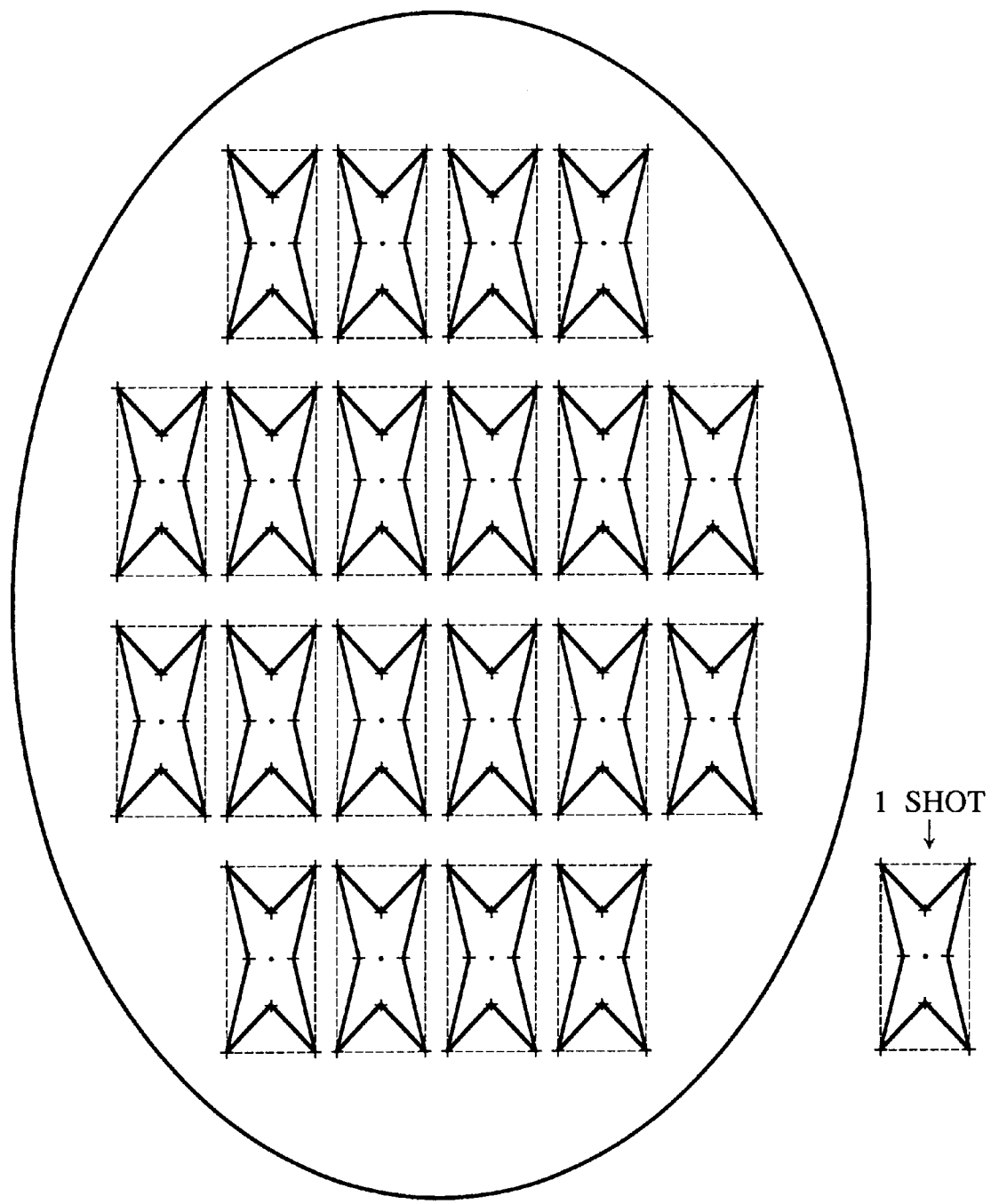
FIG. 4 is a view of a pattern exposed by a reduction projection exposure system.

In a case that positioning errors due to an optical strain of the reduction projection exposure system 10 are present in one shot size, when a pattern is formed on a wafer by the reduction projection exposure system 10, as shown in FIG. 4, the same deformed pattern is repeated for each shot.

In the present embodiment the electron beam exposure system 20 is corrected in consideration of a positioning error. That is, a positioning error data of the reduction projection exposure system 10 due to an optical strain is inputted to the electron beam exposure system 20 as a correction value (Step S16).

When a pattern is exposed by the electron beam exposure system 20, the electron beam exposure system 20 exposes the pattern to be superimposed while making corrections based on positioning errors due to the optical strain of the reduction projection exposure system 10 which has formed a pattern of a base (Step S17).

Thus, the electron beam exposure system 20 can expose the pattern superimposed with high accuracy on the pattern formed by the reduction projection exposure system 10.

As described above, according to the present embodiment, positioning errors due to an optical strain of the reduction projection exposure system in a shot size is measured by the coordinates detection system, which is separate from the electron beam exposure system for special use in the measurement, and accordingly can be given as error data based only on an optical strain amount of the reduction projection exposure system, which contain no productional errors of a reticle and measurement errors of the charged particle beam exposure system. Based on the error data corrections are made, whereby positioning errors taking place in forming a pattern by a combination of the reduction projection exposure system and the electron beam exposure system can be effectively prevented.

[A Second Embodiment]

Figure 6:
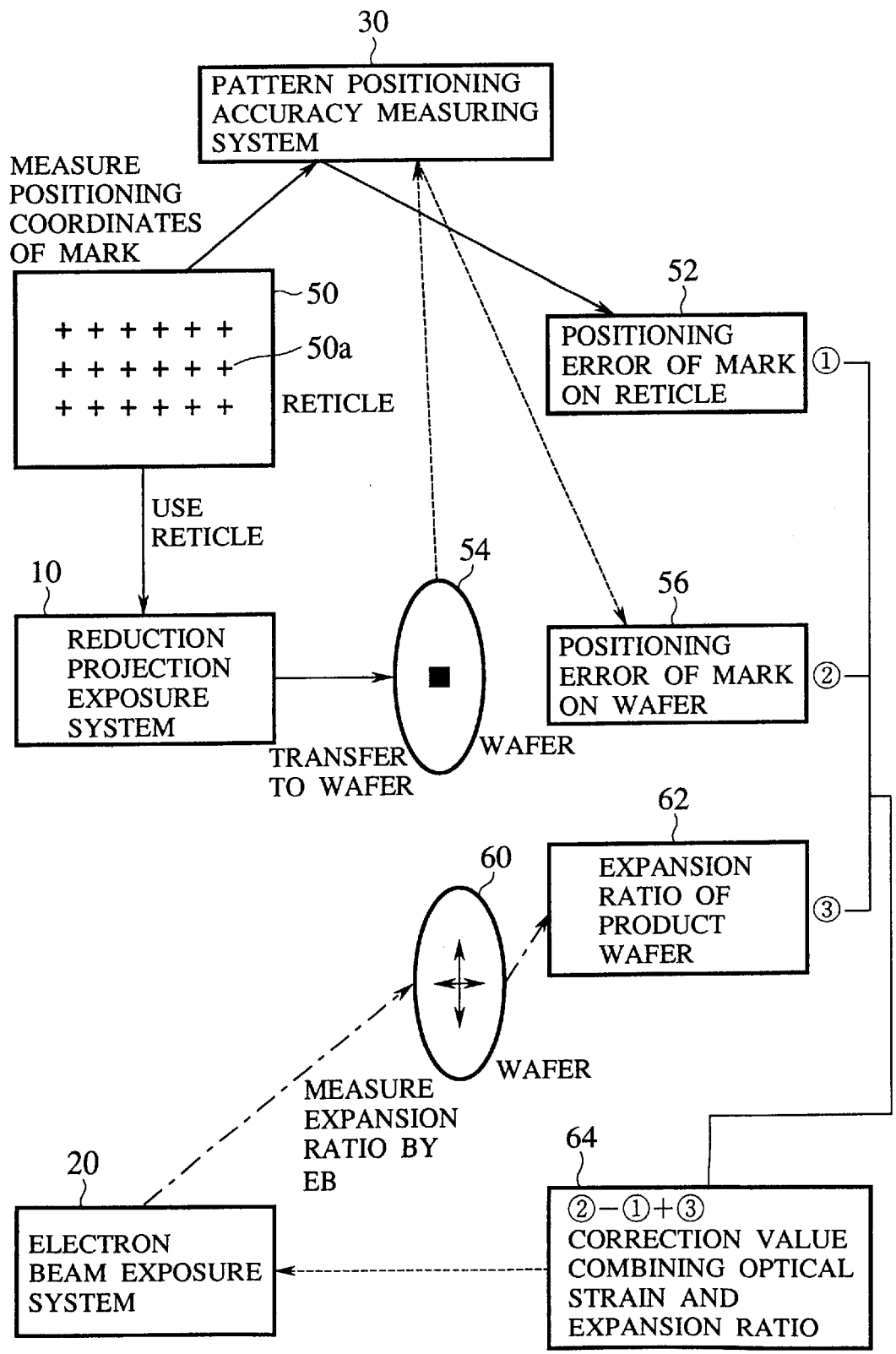
FIG. 6 is an explanatory view of the pattern exposure method according to the second embodiment of the present invention.

The pattern exposure method according to a second embodiment of the present invention will be explained with reference to FIGS. 5 to 7. The same members of the pattern exposure method according to the second embodiment as those of the first embodiment will be represented by the same reference numbers not to repeat or to simplify their explanation.

FIG. 5 is a flow chart of the pattern exposure method according to the present embodiment. FIG. 6 is an explanatory view of the pattern exposure method according to the present embodiment.

The pattern exposure method according to the present embodiment is the same as that according to the first embodiment in that exposure is performed by an electron beam exposure system while positioning errors due to an optical strain of a reduction projection exposure system which has formed a pattern of a base are being corrected. The pattern exposure method according to the present embodiment is different from that according to the first embodiment in that as shown in FIG. 6 even information of an expansion ratio of a wafer is fed back as correction data.

The pattern exposure method according to the present embodiment will be explained with reference to the flow chart of FIG. 5.

First, in the same way as in the pattern exposure method according to the first embodiment positioning errors of measurement marks on a reticle, and positioning errors of the measurement marks on a wafer are measured, and based on measured values an optical strain which is intrinsic to a stepper is given (Step S21).

Then, a product wafer 60 with a resist applied to is set on a reduction projection exposure system 10, and a required device pattern (e.g., a pattern for forming contact holes) is transferred onto the product wafer 60. At this time, simultaneously therewith a required measurement pattern is transferred onto, e.g., scribe lines of the product wafer 60. The measurement pattern is for measuring an expansion ratio of the product wafer 60 in a later step (Step S22).

Then, the resist applied to the product wafer 60 is developed, and with the resist as a mask the wafer is etched, and the resist is removed. Thus, the required device pattern is formed in a device region of the product wafer 60, and the measurement pattern for measuring an expansion ratio of the wafer is formed on the scribe lines. The product wafer 60 is thermally expanded in the following thermal steps, such as a CVD step, a diffusion step, etc., and proceeds to a photolithography step of exposing by electron beams.

Next, in the photolithography step a resist for the EB exposure is applied to the product wafer 60, and then the product wafer 60 with the resist applied to is set on the electron beam exposure system 20.

Then, electron beams scan the scribe lines of the product wafer 60 to measure coordinates of the measurement pattern on the product wafer 60, based on intensity changes of the reflected electron beams. The measurement pattern is formed for respective shots of the reduction projection exposure system 10, and accordingly a coordinate spacing between the measurement patterns on the product wafer 60 is computed to give a wafer expansion ratio (Step S23).

A wafer expansion ratio is measured for each product wafer 60 before electron beam exposure, and temporarily stored in a memory as expansion ratio data 62 (scale correction data) of expansion of the product wafer 60 (Step S24).

Then, based on positioning error data 58 stored in a memory of a coordinates detection system 30 and the expansion data 62, correction data 64 considering expansion of the wafer is computed.

When a pattern is exposed by the electron beam exposure system 20, based on the correction data 64, a device pattern (e.g., an interconnection forming pattern) to be superimposed is exposed while corrections are made by positioning errors due to an optical strain of the reduction projection exposure system 10 and the wafer expansion ratio, based on the correction data 64 (Step S25).

Thus, the electron beam exposure system 20 can expose a pattern superimposed with high accuracy on a pattern formed by the reduction projection exposure system 10 even in a case a wafer is expanded due to heat.

Figure 7:
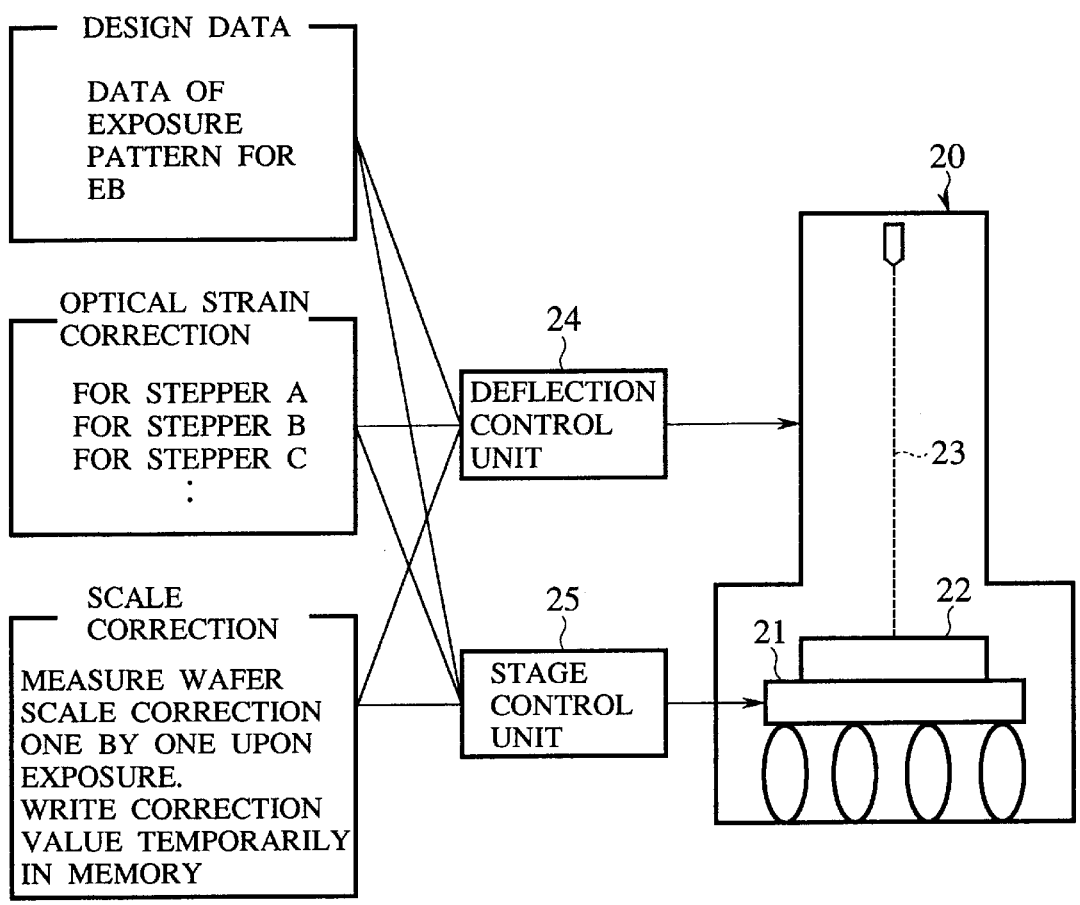
FIG. 7 is an explanatory view of the pattern exposure method using a number of reduction projection exposure systems.

FIG. 7 is an explanatory view of the correction by the electron beam exposure system 20 when a number of reduction projection exposure systems A, B, C, . . . are used, and even expansion ratio correction of a product wafer is considered.

The basic principle of the electron beam exposure system 20 is that a wafer 22 is mounted on a stage 21, and an electron beam 23 is deflected to draw the pattern on the wafer 22. An electron beam 23 is controlled by a deflection control unit 24, and the stage 21 is controlled by a stage control unit 25. A position of the exposure of a wafer 22 is determined by a displacement amount of the stage 22 and a deflection amount of an electron beam 23.

The electron beam exposure system 20 is basically controlled for the exposure, based on design data, while optical strain correction of the reduction projection exposure system 10 is made, and scale correction for expansion of the product wafer due to temperature is made.

For the optical strain correction, data of positioning errors due to an optical strain are measured in advance by the coordinates detection system 30 for the respective reduction projection exposure systems A, B, C, . . .

For the scale correction, product wafers for the pattern to be exposed are measured one by one, and based on the measured values correction amounts are determined.

In exposing the pattern by the electron beam exposure system 20, the pattern is exposed, correcting design data in consideration of correction values of positioning error data due to optical strains of the reduction projection exposure system which has formed the pattern to be superimposed, and correction values of the scale correction of the product wafers.

As described above, according to the present embodiment, correction data are prepared based on amounts of optical strains of the reduction projection exposure system and expansion ratios of the wafers, and based on the correction data exposure is conducted by the electron beam exposure system, whereby positioning errors can be more effectively prevented when a pattern is formed by a combination of the reduction projection exposure system and the electron beam exposure system.

[A Third Embodiment]

The pattern exposure method according to a third embodiment of the present invention will be explained with reference to FIGS. 8 to 10. The same members of the pattern exposure method according to the present embodiment as those of the first or the second embodiment are represented by the same reference numbers not to repeat or to simplify their explanation.

Figure 8:
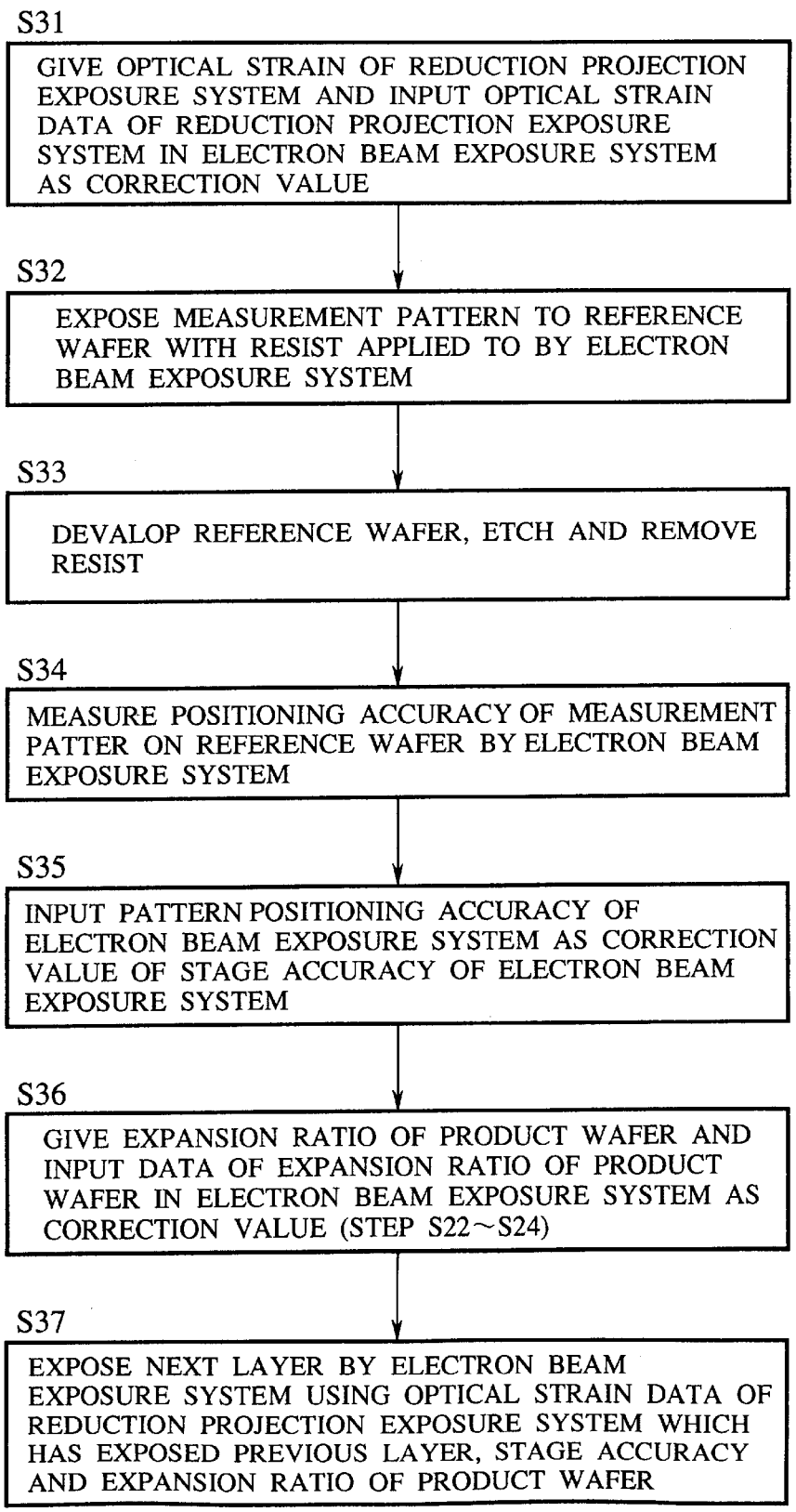
FIG. 8 is a flow chart of the pattern exposure method according to a third embodiment of the present invention.
Figure 9:
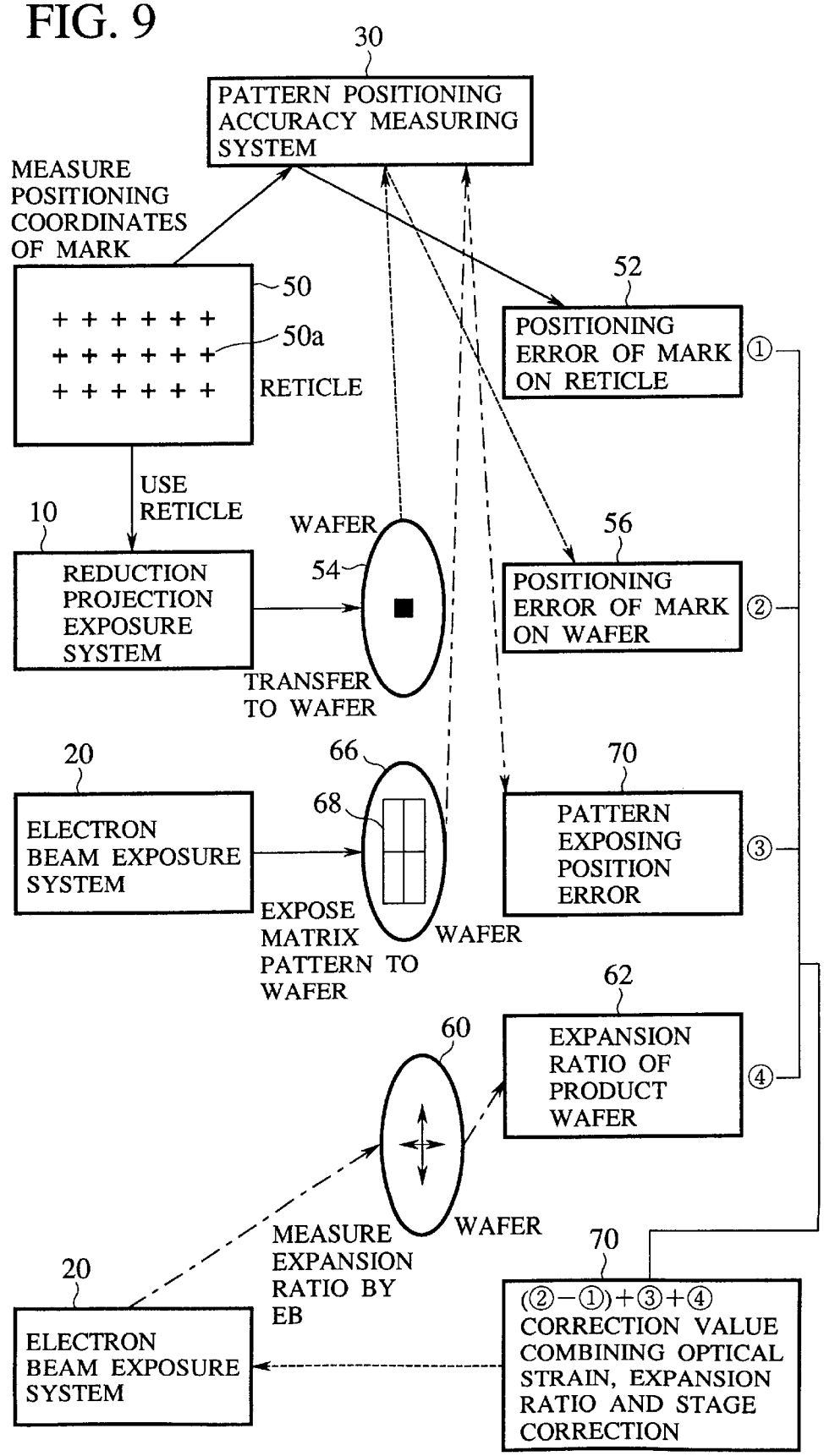
FIG. 9 is an explanatory view of the pattern exposure method according to a third embodiment of the present invention.

FIG. 8 is a flow chart of the pattern exposure method according to the present embodiment, and FIG. 9 is an explanatory view of the pattern exposure method according to the present embodiment.

The pattern exposure method according to the present embodiment is the same as that according to the second embodiment in which exposure is conducted by an electron bema exposure system, correcting positioning errors based on an optical strain of a reduction projection exposure system which forms a pattern of a base and expansion ratios of wafers. The pattern exposure method according to the present embodiment is different from that according to the second embodiment in that as shown in FIG. 9 exposure positioning accuracy (stage accuracy) of the electron beam exposure system is also fed back as correction data.

The pattern exposure method according to the present embodiment will be explained with reference to the flow chart of FIG. 8.

First, in the same way as in the pattern exposure method according to the first embodiment positioning errors of measurement marks on a reticle, and positioning errors of the measurement marks on a wafer are measured, and based on measured values optical strains intrinsic to the stepper are given (Step S31).

Then, exposure positioning accuracy (stage accuracy) of the electron beam exposure system is measured.

First, a wafer with a resist applied to is prepared as a reference wafer 66. A measurement mark 68 in the form of, e.g., a matrix pattern is drawn on the reference wafer 66 by the electron beam exposure system 20 (Step S32)

Then, the resist applied to the reference wafer 66 is developed, and with the resist as a mask the wafer is etched. The resist is removed (Step S33).

Then, positioning accuracy of the measurement pattern 68 transferred onto the reference wafer 66 is measured by a coordinates detection system 30 (Step S34). The measurement data is indicative of stage accuracy of the electron beam exposure system 20 and is stored as positioning error data 70 (stage correction data) in a memory (not shown) of the coordinates detection system 30 (Step S35).

Next, in the same way as in the second embodiment, data of expansion ratio of a product wafer 60 is given (Step S36).

Next, based on the positioning error data 58, 70 and the expansion ratio data 62 stored in the memory of the coordinate detection system 30, correction data 72 containing these parameters is computed and is inputted to the electron beam exposure system 20.

When the pattern is exposed by the electron beam exposure system 20, the pattern to be superimposed is exposed while making corrections based on the positioning errors due to optical strains of the reduction projection exposure system 10 which has formed the pattern of the base, the stage accuracy of the electron beam exposure system 20 and the wafer expansion ratio (Step S37).

Thus, the electron beam exposure system 20 can expose the pattern superimposed with high accuracy on a pattern formed by the reduction projection exposure system 10.

Figure 10:
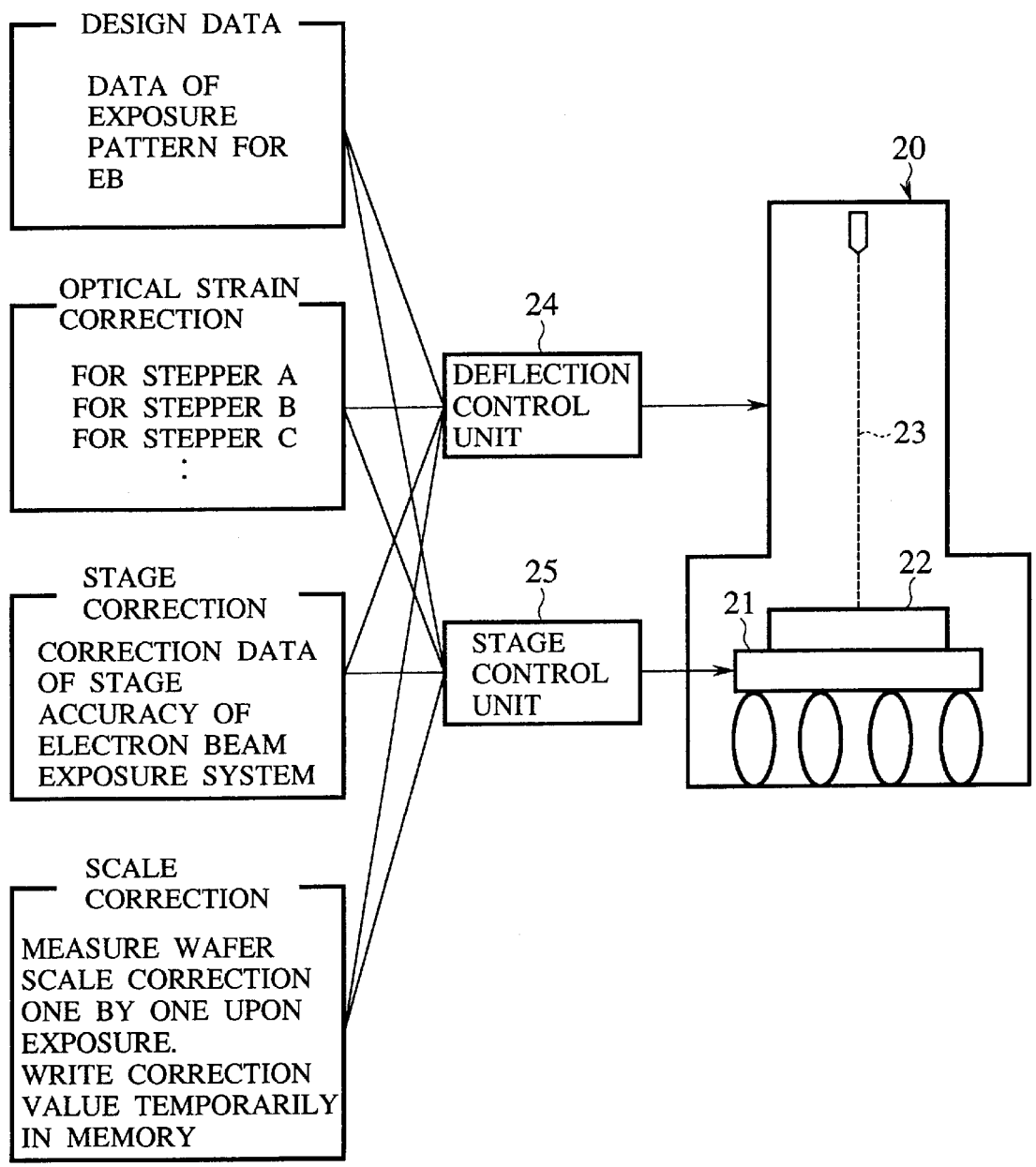
FIG. 10 is an explanatory view of the pattern exposure method using a number of reduction projection exposure systems.

FIG. 10 is an explanatory view of the correction of the electron beam exposure system 20 using a number of reduction projection exposure systems A, B, C, . . . , even in consideration of correction of the product wafer expansion ratio and the stage accuracy of the electron beam exposure system.

The electron beam exposure system 20 is basically controlled for the exposure, based on design data, and is also controlled for the optical strain correction of the reduction projection exposure systems, the scale correction of the wafers expanded due to temperature and the stage correction of the electron beam exposure system.

In the optical strain correction, data of positioning errors due to optical strains measured by the coordinates detection system 30 for the respective reduction projection exposure systems A, B, C, . . . are prepared in advance.

In the stage correction, data 70 of positioning errors (stage correction data) of the electron beam exposure system 20 are prepared in advance by the coordinates detection system 30.

In the expansion ratio correction (scale correction), respective wafers for the pattern to be exposed to are measured to determine correction amounts based on measured values. The correction values are temporarily stored in a memory (not shown).

When the pattern is exposed by the electron beam exposure system 20, the pattern is exposed, correcting the design data in consideration of the correction values based on the data of positioning errors due to optical strains of the reduction projection exposure system which have formed the pattern to be superimposed, the correction values based on the stage correction data which reflect stage accuracy of the electron beam exposure system and the correction values of the scale correction of the wafers.

As described above, according to the present embodiment, correction data are prepared based on amounts of optical strains of the reduction projection exposure system, stage accuracy and expansion ratios of wafers, and based on the correction data, exposure is conducted by the electron beam exposure system, whereby positioning errors in forming a pattern by a combination of the reduction projection exposure systems and the electron beam exposure system can be more effectively prevented.

[A Modification]

The present invention is not limited to the above-described embodiments and contains other various modifications.

Figure 11A:
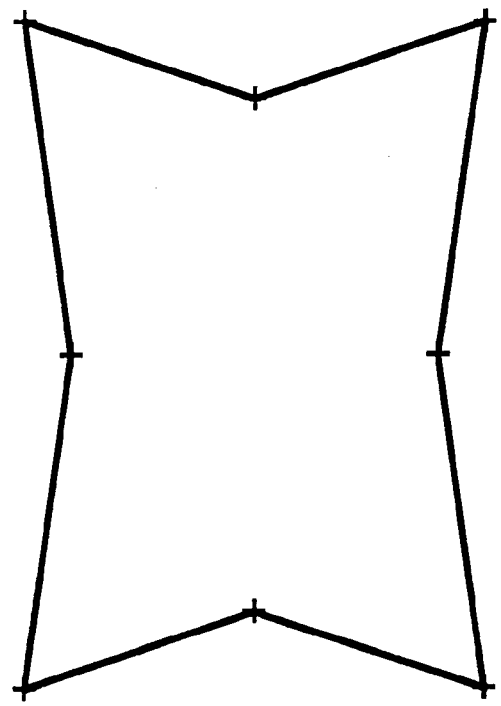
FIGS. 11A and 11B are explanatory views of the pattern exposure method according to a modification of the embodiments of the present invention (Part 1).
Figure 11B:
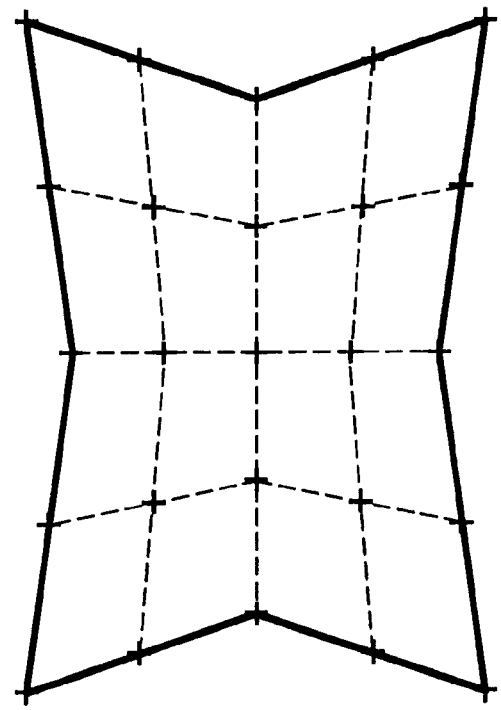

To give instances, in the above-described embodiments optical strains as well in the region of a shot size are measured at the measurement points arranged in a matrix, but it is possible that optical strains are measured only at the outermost peripheral measurement points. That is, as shown in FIG. 11A, optical strains alone are measured at the outermost peripheral measurement points (+ marks) in the region of a shot size as shown in FIG. 11A, and at respective measurement points, as shown in FIG. 11B in the inner part of the region of the shot size positioning errors are converted as, e.g., linearly changing, and the correction is made based on the converted positioning errors.

In the above-described embodiments, optical strains are measured in the region of a shot size, but it is possible that optical strains are measured in the region of a maximum exposure size of the reduction projection exposure system.

A shot size of the reduction projection exposure system is a size suitable for a device to be fabricated, and shot sizes are different for devices. Even in a case that the same reduction projection exposure system is used, when different shot sizes are used, it is necessary to again measure optical strains. Then, optical strains are measured at measurement points arranged in a matrix in the region of a maximum exposure size of the reduction projection exposure system, whereby even when shot sizes are different, optical strains for the shot sizes can be given without the necessity of repeated measurement.

Even in a case that optical strains are measured in the region of a maximum exposure size of the reduction projection exposure system, it is possible that optical strains are measured only at the outermost peripheral measurement points of the region of a maximum exposure size, and at respective measurement points in the inner part of the region of the shot size optical strains are converted as, e.g., linearly changing.

Figure 12:
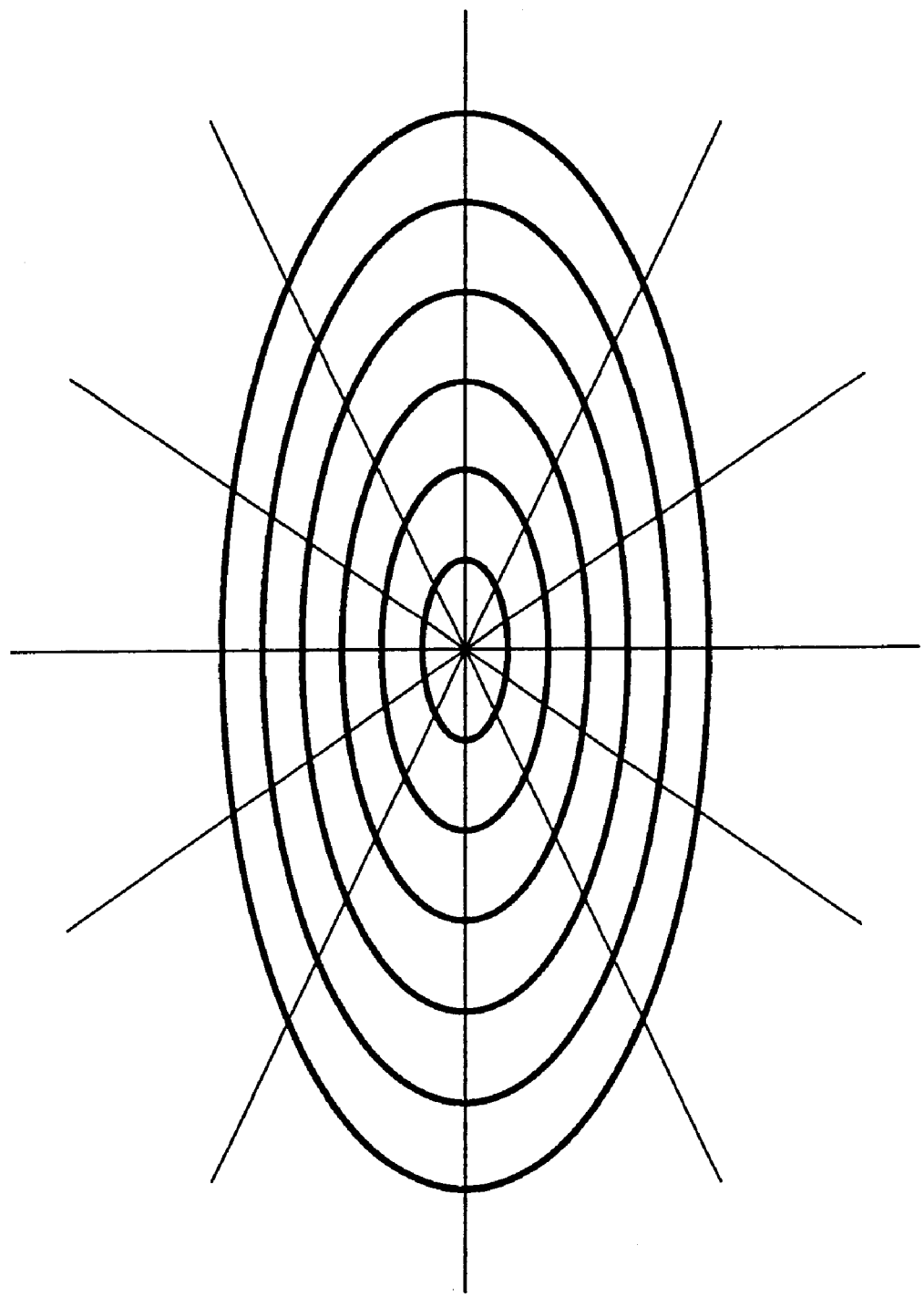
FIG. 12 is an explanatory view of the pattern exposure method according to a modification of the embodiments of the present invention (Part 2).

It is not essential that the measurement of optical strains are based on a rectangular region, and it is possible that coordinates are measured at arbitrary points on radial lines with respect to the central point of an optical axis as an origin (see FIG. 12). The reduction projection exposure system is generally constituted by a lens optical system which has point symmetry with respect to the optical axis, and it is considered that optical strains radially change. Accordingly such optical strains are measured, whereby the optical strain correction can be performed with higher accuracy.

In the above-described embodiments, the coordinates detection system for measuring optical strains of the reduction projection exposure system and the coordinates detection system for measuring stage accuracy of the electron beam exposure system are the one and the same, which is for computing correction values of higher accuracy with less errors among measured data. Accordingly, the coordinates detection system for measuring optical strains of the reduction projection exposure system and the coordinates detection system for measuring stage accuracy of the electron beam exposure system are not essentially one and the same, and different detection systems may be used for the respective measurements. However, to sufficiently exhibit the advantageous effects of the present invention, it is preferable that a measured value convertibility between these detection systems is at least below about 0.2 μm.

In the above-described embodiments the pattern exposure method combines the reduction projection exposure system and the electron beam exposure system, but the pattern exposure method is applicable to a case that the reduction projection exposure system, and an ion beam or other charged particle beam exposure system.

What is claimed is:

1. A pattern exposure method for exposing a pattern by a reduction projection exposure system and an electron beam exposure system, the method comprising:

the first step of measuring by a first coordinates detection system an optical strain in a region of a prescribed size to be exposed by the reduction projection exposure system;

the second step of exposing a first pattern of a shot size by the reduction projection exposure system; and the third step of exposing by the electron beam exposure system a second pattern to be superimposed on the first pattern, correcting based on a correction value which is based on the optical strain in the region of the prescribed size measured by the first coordinates detection system.

2. A pattern exposure method according to claim 1, wherein in the first step, the optical strain of the reduction projection exposure system is measured by subtracting a positioning error of a measurement pattern arranged on a reticle from positioning coordinates of the measurement pattern transferred onto a wafer by the use of the reticle.

3. A pattern exposure method according to claim 2, further comprising prior to the third step the step of measuring an expansion ratio of the wafer with the first pattern exposed, based on the first pattern, in the third step, the second pattern to be superimposed on the first pattern is exposed by the electron beam exposure system, correcting in consideration of, in addition, a correction value based on the expansion ratio of the wafer.

4. A pattern exposure method according to claim 2, further comprising the step of measuring displacement accuracy of a stage of the electron beam exposure system by a second coordinates detection system, in the third step the second pattern to be superimposed on the first pattern is exposed by the electron beam exposure system, correcting in consideration of, in addition, a correction value based on the displacement accuracy of the stage measured by the second coordinates detection system.

5. A pattern exposure method according to claim 1, further comprising prior to the third step the step of measuring an expansion ratio of the wafer with the first pattern exposed, based on the first pattern, in the third step, the second pattern to be superimposed on the first pattern is exposed by the electron beam exposure system, correcting in consideration of, in addition, a correction value based on the expansion ratio of the wafer.

6. A pattern exposure method according to claim 5, further comprising the step of measuring displacement accuracy of a stage of the electron beam exposure system by a second coordinates detection system, in the third step the second pattern to be superimposed on the first pattern is exposed by the electron beam exposure system, correcting in consideration of, in addition, a correction value based on the displacement accuracy of the stage measured by the second coordinates detection system.

7. A pattern exposure method according to claim 6, wherein a measured value convertibility between the first and the second coordinates detection systems is below 0.2 $\mu$m.

8. A pattern exposure method according to claim 1, further comprising the step of measuring displacement accuracy of a stage of the electron beam exposure system by a second coordinates detection system, in the third step the second pattern to be superimposed on the first pattern is exposed by the electron beam exposure system, correcting in consideration of, in addition, a correction value based on the displacement accuracy of the stage measured by the second coordinates detection system.

9. A pattern exposure method according to claim 6, wherein the first and the second coordinates detection systems are one and the same.

10. A pattern exposure method according to claim 1, wherein in the first step the optical strain is measured in the region of the shot size.

11. A pattern exposure method according to claim 10, wherein in the first step the optical strain is measured at an outermost periphery of the region of the shot size.

12. A pattern exposure method according to claim 11, wherein in the third step an optical strain in an inner part of the region of the shot size is converted from the optical strain in the outermost periphery of the region of the shot size measured in the first step, and based on a correction value based on the converted optical strain the electron beam exposure system is corrected.

13. A pattern exposure method according to claim 10, wherein in the first step the optical strain is measured at each of measurement points arranged in a matrix in a inner part of the region of the shot size.

14. A pattern exposure method according to claim 1, wherein in the first step the optical strain is measured in a region of a maximum exposure size containing the shot size of the reduction projection exposure system.

15. The pattern exposure method according to claim 14, wherein in the first step the optical strain is measured in an outermost periphery of the region of the maximum exposure size.

16. A pattern exposure method according to claim 15, wherein in the third step an optical strain in an inner part of the region of the shot size is converted from the optical strain in the outermost periphery of the region of the maximum exposure size measured in the first step, and based on a correction value based on the converted optical strain the electron beam exposure system is corrected.

17. A pattern exposure method according to claim 14, wherein in the first step the optical strain are measured at each of measurement points arranged in a matrix in an inner part of the region of the maximum exposure size.

18. A pattern exposure method according to claim 1, wherein in the first step the optical strain is measured at each of measurement points arranged on radial lines with respect to an optical axis of the reduction projection exposure system.

19. A pattern exposure method according to claim 1, wherein, in the first step, optical strains of plural reduction projection exposure systems are measured, and correction values based on the optical strains of the plural reduction projection exposure systems are inputted into the electron beam exposure system;

in the second step, the first pattern is exposed using one of the plural reduction projection exposure systems; and in the third step, the second pattern is exposed referring the correction value of the reduction projection exposure system which has exposed the first pattern.

20. A pattern exposure system for exposing a pattern by a reduction projection exposure system and an electron beam exposure system, the system comprising a coordinates detection system for measuring an optical strain in a region of a prescribed size to be exposed by the reduction projection exposure system, the system being for conducting a pattern exposure method comprising the first step of measuring by the coordinates detection system an optical strain in the region of the prescribed size to be exposed by the reduction projection exposure system; a second step of exposing a first pattern of a shot size by the reduction projection exposure system; and the third step of exposing by the electron beam exposure system a second pattern to be superimposed on the first pattern, correcting based on a correction value which is based on the optical strain in the region of the prescribed size measured by the coordinates detection system.

21. A pattern exposure system according to claim 20, for conducting a pattern exposure method which further comprises prior to the third step the step of measuring an expansion ratio of the wafer with the first pattern exposed, based on the first pattern, and in which in the third step the second pattern to be superimposed on the first pattern is exposed by the electron beam exposure system, correcting in consideration of, in addition, a correction value based on the expansion ratio of the wafer.

22. A pattern exposure system according to claim 20, for conducting a pattern exposure method which further comprises the step of measuring displacement accuracy of a stage of the electron beam exposure system by the coordinates detection system, and in which in the third step the second pattern to be superimposed on the first pattern is exposed by the electron beam exposure system, correcting in consideration of, in addition, a correction value based on the displacement accuracy of the stage measured by the coordinates detection system.

23. A pattern exposure system according to claim 20, further comprising plural reduction projection exposure systems, and the electron beam exposure system being set correction values of optical strains of the plural reduction projection exposure systems, and in which in the third step the second pattern is exposed referring the correction value of the reduction projection exposure system which has exposed the first pattern.

* * * * *

UNITED STATES PATENT AND TRADEMARK OFFICE
CERTIFICATE OF CORRECTION

PATENT NO. : 6,124,598
DATED : September 26, 2000
INVENTOR(S) : Atsushi TAKIZAWA It is certified that error appears in the above-identified patent and that said Letters Patent is hereby corrected as shown below:
Title page, item [57]

Abstract line 1, change "formes" to --forms--.

Col. 11,    line 9, change "claim 2" to --claim 1--;
              line 18, change "claim 2" to --claim 1--;
              line 29, change "claim 1" to --claim 2--;
              line 38, change "claim 5" to --claim 2--;
              line 49, change "claim 6" to --claim 8--;
              line 53, change "claim 1" to --claim 3--;
              line 64, change "claim 6" to --claim 8--.

Signed and Sealed this

First Day of May, 2001

Attest:

NICHOLAS P. GODICI

Attesting Officer    Acting Director of the United States Patent and Trademark Office